United States Patent
Inoue et al.

(10) Patent No.: US 9,644,142 B2
(45) Date of Patent: May 9, 2017

(54) RED PHOSPHOR MATERIAL AND LIGHT-EMITTING DEVICE

(71) Applicant: Panasonic Intellectual Property Management Co., Ltd., Osaka (JP)

(72) Inventors: Osamu Inoue, Osaka (JP); Kojiro Okuyama, Nara (JP); Mitsuru Nitta, Osaka (JP); Seigo Shiraishi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 103 days.

(21) Appl. No.: 14/690,355

(22) Filed: Apr. 17, 2015

(65) Prior Publication Data

US 2015/0218445 A1    Aug. 6, 2015

Related U.S. Application Data

(63) Continuation of application No. PCT/JP2014/002964, filed on Jun. 4, 2014.

(30) Foreign Application Priority Data

Jun. 21, 2013  (JP) .................. 2013-130809

(51) Int. Cl.
    C09K 11/78    (2006.01)
    H01L 33/50    (2010.01)
    C09K 11/77    (2006.01)
    C04B 35/495   (2006.01)
    F21K 2/00     (2006.01)

(52) U.S. Cl.
    CPC ........ C09K 11/7794 (2013.01); C04B 35/495 (2013.01); F21K 2/00 (2013.01); H01L 33/502 (2013.01)

(58) Field of Classification Search
    CPC . C09K 11/7794; C09K 11/025; H01L 33/502; C04B 35/495; C04B 2111/807
    See application file for complete search history.

(56) References Cited

U.S. PATENT DOCUMENTS

| | | | |
|---|---|---|---|
| 2008/0001122 A1* | 1/2008 | Odaki | ............... C09K 11/7736 252/301.5 |
| 2009/0174309 A1 | 7/2009 | Schmidt et al. | |
| 2010/0244066 A1 | 9/2010 | Chiu et al. | |
| 2012/0256533 A1 | 10/2012 | Seto et al. | |

FOREIGN PATENT DOCUMENTS

| | | |
|---|---|---|
| JP | 2004-300247 | 10/2004 |
| JP | 2004-359842 | 12/2004 |
| JP | 2005-008843 | 1/2005 |
| JP | 2006-348262 | 12/2006 |
| JP | 2007-254517 | 10/2007 |
| JP | 2008-007644 | 1/2008 |
| JP | 2009-541520 | 11/2009 |
| JP | 2010-229388 | 10/2010 |
| JP | 2010-248645 | 11/2010 |
| WO | 2010/114061 | 10/2010 |

OTHER PUBLICATIONS

International Search Report of PCT application No. PCT/JP2014/002964 dated Aug. 26, 2014.
Phosphor Research Society Phosphor Handbook Ohmsya, Tokyo, 1987 (Partial Translation).

* cited by examiner

*Primary Examiner* — Carol M Koslow
(74) *Attorney, Agent, or Firm* — McDermott Will & Emery LLP

(57) ABSTRACT

A red phosphor material includes an essential component represented by a formula of $A_{2-2x}R_xEu_ySm_zLn_{x-y-z}M_2O_8$ as a main component, where A represents at least one selected from Ca and Sr; R represents at least one selected from Li, Na, and K; Ln represents at least one selected from La, Gd, and Y; M represents at least one selected from W and Mo; and x, y, and z are numerical values that satisfy $0.2 \leq x \leq 0.7$, $0.2 \leq y+z \leq 0.6$, $0.005 \leq z \leq 0.04$, and $x-y-z \geq 0$. A light-emitting device includes an excitation light source and the red phosphor material that absorbs excitation light emitted by the excitation light source and emits red light.

21 Claims, 2 Drawing Sheets

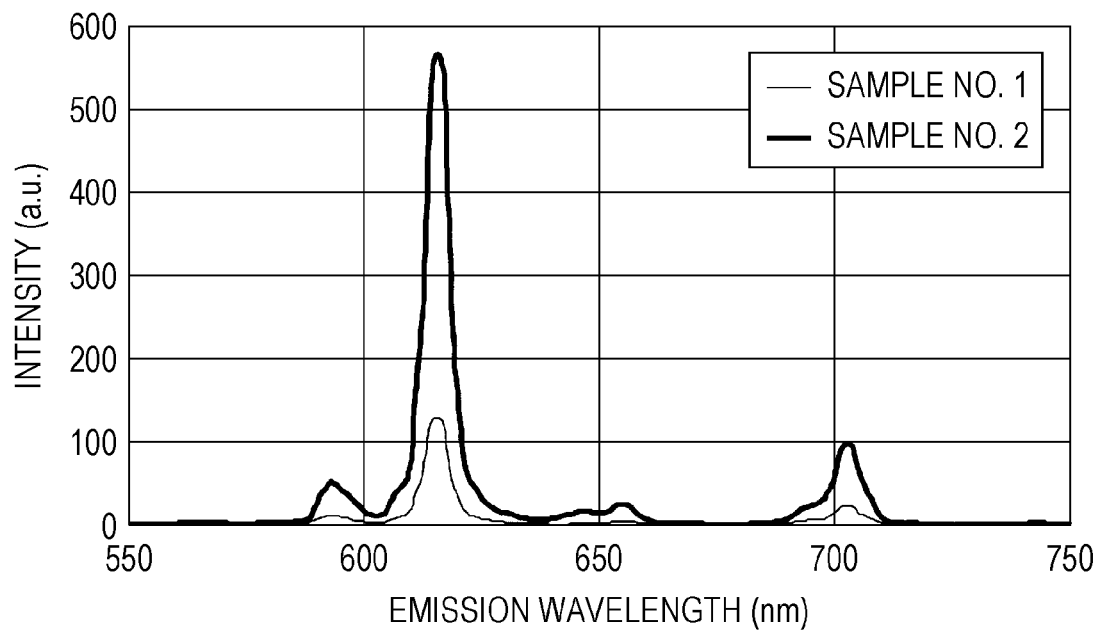
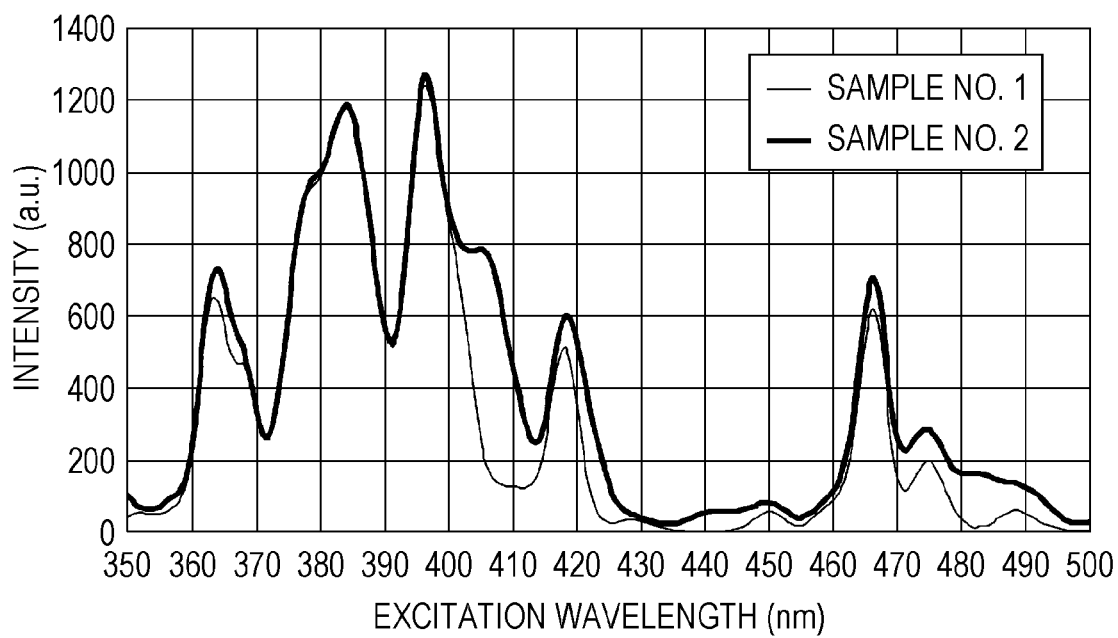

RED PHOSPHOR MATERIAL AND LIGHT-EMITTING DEVICE

BACKGROUND

1. Technical Field

The present disclosure relates to a red phosphor material that can be used for light-emitting devices such as light sources of projectors, light sources of vehicle-mounted head lamps, and light sources of white LED lighting apparatuses, the red phosphor material being used in combination with, for example, a light-emitting diode (LED) or a semiconductor laser diode (LD). The present disclosure also relates to a light-emitting device including the red phosphor material.

2. Description of the Related Art

Lighting apparatuses employing white LEDs have higher efficiency and longer longevity than existing lighting apparatuses. From the standpoint of resource savings and energy conservation, such lighting apparatuses have come to be widely introduced for commercial use and home use.

Most commonly used white LEDs include a blue LED chip and a phosphor substance that partially absorbs blue light emitted by the LED chip and emits yellow light. This configuration causes mixing of blue light and its complementary-color light, that is, yellow light, resulting in generation of a pseudo-white color. There is ongoing development of other white LEDs employing a combination of a blue LED chip, a green phosphor substance, and a red phosphor substance in order to meet requirements in terms of color rendering, color reproducibility, or the like. There is also ongoing development of still other white LEDs employing a combination of an LED chip emitting light in the near ultraviolet to blue violet region and three phosphor substances that are a blue phosphor substance, a green phosphor substance, and a red phosphor substance.

For applications including light sources of projectors and light sources of vehicle-mounted head lamps, which require high emission energy, there is ongoing development of light sources employing a combination of an LD emitting light in the near ultraviolet to blue violet region and a phosphor substance.

A known red phosphor substance that can be excited with light ranging from near-ultraviolet light to blue light is a phosphor substance that is represented by the composition formula $Ca_{2-2x}Li_xEu_xW_2O_8$ and that emits light in the red color region with $Eu^{3+}$ serving as the luminescent center (for example, refer to Japanese Unexamined Patent Application Publication Nos. 2007-254517, 2008-7644, and 2010-229388).

SUMMARY

The inventors of the present disclosure have focused on the point that red phosphor substances have been developed mainly with emphasis on light-emitting efficiency and without performing studies on the temperature characteristics of red phosphor substances. Although light-emitting efficiency is an important characteristic, a relatively low light-emitting efficiency can be compensated for by, for example, increasing the amount of phosphor substance used. In contrast, poor temperature characteristics cause problems: in particular, a low luminance retention ratio at high temperature results in, in response to the usage environment, variation in brightness or variation in color tone due to occurrence of disturbance in the balance between red light and excitation light or light emitted by another phosphor substance. In particular, such problems markedly tend to occur in light-emitting devices in which emission energy is high and the ambient temperature of phosphor substances easily increases.

The above-described existing red phosphor substances also have another problem in that they cannot be substantially excited with lasers or LED chips emitting light at 405 nm, which are readily available as excitation light sources.

One non-limiting and exemplary embodiment provides a red phosphor material that is easily excited with light at a wavelength of 405 nm and has a high luminance retention ratio at high temperature. Another non-limiting and exemplary embodiment provides a light-emitting device including this phosphor material.

In one general aspect, the techniques disclosed here feature a red phosphor material including an essential component represented by a formula of $A_{2-2x}R_xEu_ySm_zLn_{x-y-z}M_2O_8$ as a main component.

In the formula, A represents at least one selected from Ca and Sr; R represents at least one selected from Li, Na, and K; Ln represents at least one selected from La, Gd, and Y; M represents at least one selected from W and Mo; and x, y, and z are numerical values that satisfy $0.2 \leq x \leq 0.7$, $0.2 \leq y+z \leq 0.6$, $0.005 \leq z \leq 0.04$, and $x-y-z \geq 0$.

One non-limiting and exemplary embodiment can provide a red phosphor material that is easily excited with light at a wavelength of 405 nm and has a high luminance retention ratio at high temperature. This phosphor material can be excited with readily available excitation light sources that are lasers or LED chips emitting light at a wavelength of 405 nm, which is highly advantageous in practical use. Another non-limiting and exemplary embodiment can provide a light-emitting device in which, even at high temperature, a decrease in brightness and variation in color tone due to a decrease in the luminance of the red phosphor material tend not to occur.

It should be noted that general or specific embodiments may be implemented as a material, a device, an apparatus, a system, or a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 illustrates the emission spectrum of a red phosphor material according to an embodiment of the present disclosure;

FIG. 2 illustrates the excitation spectrum of a red phosphor material according to an embodiment of the present disclosure.

DETAILED DESCRIPTION

Figure 3:
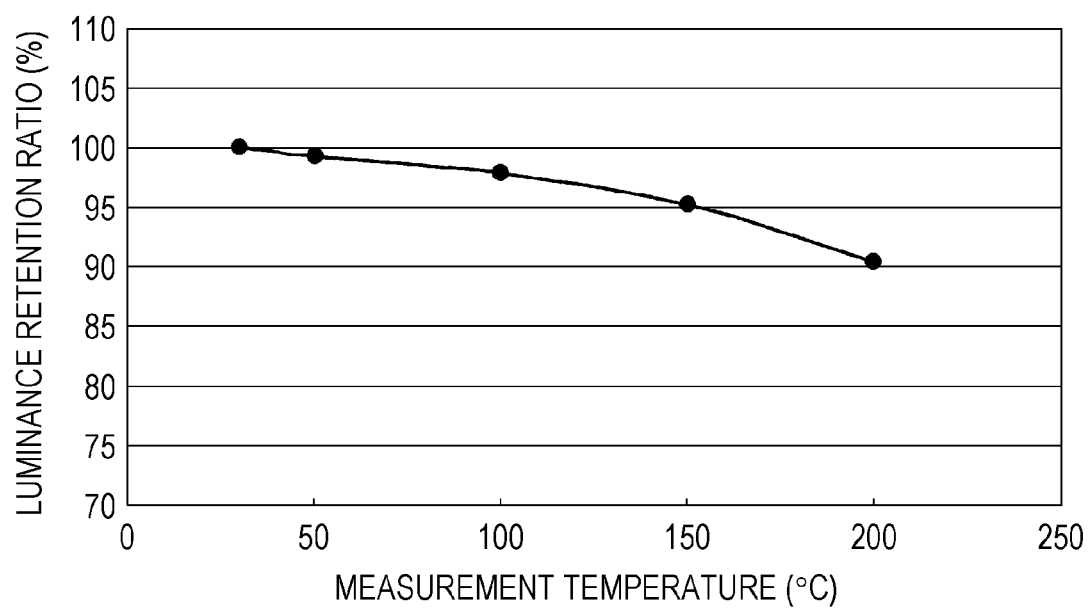
FIG. 3 illustrates the measurement temperature dependency of the luminance of a red phosphor material according to an embodiment of the present disclosure.

Hereinafter, the present disclosure will be described in detail with reference to specific embodiments. However, the present disclosure is not limited to these embodiments and modifications may be appropriately made without departing from the spirit and scope of the present disclosure.

A red phosphor material according to the present disclosure includes an essential component represented by a formula of $A_{2-2x}R_xEu_ySm_zLn_{x-y-z}M_2O_8$. This essential component serves as the main component of the red phosphor material. In this specification, the term "main component" denotes a component that accounts for 70% by weight or more of the red phosphor material, desirably 90% by weight or more, more desirably 95% by weight or more, still more desirably 98% by weight or more.

In the formula, A represents at least one selected from Ca and Sr. From the standpoint of light-emitting efficiency, A desirably includes Ca and more desirably represents Ca.

R represents at least one selected from Li, Na, and K. From the standpoint of light-emitting efficiency, R desirably includes at least one selected from Li and Na, more desirably represents at least one selected from Li and Na, and, in particular, desirably represents Li.

Ln represents at least one selected from La, Gd, and Y. From the standpoint of luminance retention ratio at high temperature, Ln most desirably represents Gd, and secondarily La. Ln desirably includes Gd, more desirably represents Gd. Ln may represent at least one selected from Gd and La.

M represents at least one selected from W and Mo. From the standpoint of luminance retention ratio, M desirably includes W, more desirably represents W.

In the formula, x, y, and z are numerical values that satisfy $0.2 \leq x \leq 0.7$, $0.2 \leq y+z \leq 0.6$, $0.005 \leq z \leq 0.04$, and $x-y-z \geq 0$. Unless the ranges of $0.2 \leq x < 1.0$ and $0.2 \leq y+z \leq 0.7$ are satisfied, the luminance retention ratio decreases or the light-emitting efficiency decreases. Regarding the range of z, in a case where z is less than 0.005, excitation cannot be substantially achieved with light at 405 nm; and in a case where z is more than 0.08, both of the light-emitting efficiency and the luminance retention ratio decrease.

The "$x-y-z$", which defines the content of Ln, is desirably 0.1 or more ($x-y-z \geq 0.1$), more desirably 0.2 or more, may be 0.6 or less, may be 0.5 or less.

The value x desirably satisfies $0.2 \leq x \leq 0.7$. The values y and z desirably satisfy $0.2 \leq y+z \leq 0.6$. The value z desirably satisfies $0.005 \leq z \leq 0.04$. In a case where x, y, and z satisfy all these ranges, it is easy to achieve a luminance retention ratio of 90% or more in the range of 30° C. to 200° C.

When a red phosphor material according to an embodiment of the present disclosure is produced so as to have an emission wavelength of 615 nm, a measured excitation spectrum for the red phosphor material has a peak at a wavelength of 405 nm. It is not necessary that this peak wavelength be strictly 405 nm. For example, the peak wavelength may shift from 405 nm by about ±3 nm. The peak at a wavelength of 405 nm desirably has a peak intensity that is 30% or more, in particular, 40% or more of the peak intensity of the maximum peak in the wavelength region of 350 to 500 nm.

In a red phosphor material according to an embodiment of the present disclosure, a ratio of a luminance of emitted light as a result of excitation with light having a wavelength of 405 nm at 200° C. to a luminance of emitted light as a result of excitation with light having a wavelength of 405 nm at 30° C. is 85% or more, desirably 90% or more. The luminance retention ratio can be measured by a method that will be described in detail in EXAMPLES below.

A red phosphor material according to an embodiment of the present disclosure may contain, in addition to the essential component, a desired component. This desired component is desirably an alkali metal oxide, in particular, at least one selected from $Li_2O$, $Na_2O$, and $K_2O$. Hereafter this desired component will be referred to as an excess component because it can be considered as an excess component in terms of R contained in the essential component defined by the above-described formula. The above-described desired component is also desirably at least one selected from $CaCl_2$, $SrCl_2$, $BaCl_2$, LiF, and $ZnF_2$. Hereafter this desired component will be referred to as an addition component.

The content of the excess component and/or the addition component relative to the entirety of the red phosphor material is desirably 0.05% to 2.0% by weight. This content of the excess component and/or the addition component may be adjusted, in accordance with, for example, the composition of the essential component, to be in the range of 0.1% to 2.0% by weight, in the range of 0.1% to 1.0% by weight, if necessary, in the range of 0.15% to 1.0% by weight.

A red phosphor material according to an embodiment of the present disclosure consists essentially of the essential component and the excess component and/or the addition component. A red phosphor material according to another embodiment of the present disclosure consists essentially of the essential component. In this specification, "consists essentially of" means that the content of such a component or components relative to the entirety of the material is 99% by weight or more, desirably 99.5% by weight or more, more desirably 99.9% by weight or more. The term "essentially" is intended to permit the presence of trace components represented by impurities unavoidably introduced from raw materials or the like.

A red phosphor material according to an embodiment of the present disclosure is a sinter. The sinter can be obtained by sintering powder raw materials. In this case where the red phosphor material is a sinter, effects caused by light scattering are reduced and the absorption ratio of excitation light increases, resulting in an increase in light-emitting efficiency. In a case where the sinter is provided so as to have a small sample thickness, excitation light can be partially passed through the sinter. In another case, excitation light may be used so as to be reflected by the sinter.

The sinter desirably has a density of 5.0 $g/cm^3$ or more, more desirably 5.5 $g/cm^3$ or more. By increasing the density, the light-emitting efficiency can be sufficiently increased and light transmittance can be increased.

Both of the excess component and the addition component exert an effect of promoting densification of a sinter. This effect results in a further increase in the light-emitting efficiency. Accordingly, in a case of providing a sinter, it is particularly desirable to use the excess component and/or the addition component. From this standpoint, particularly desired excess components are $Li_2O$ and/or $Na_2O$. From this standpoint, particularly desired addition components are $CaCl_2$ and/or LiF.

The red phosphor material may contain a small amount of an auxiliary component other than the excess component and the addition component. This auxiliary component may be, for example, a component in which at least a part of the elements of the formula of the essential component serving as a main component is substituted with an element other than the elements defined in the formula. For example, A may be substituted with Zn, Mg, or Ba; R may be substituted with Rb or Cs; and Ln may be substituted with Sc or Lu. Even when the red phosphor material contains such an auxiliary component, the main component of the material is the above-described essential component.

The red phosphor material may be produced by any of a solid-phase method, a liquid-phase method, and a gas-phase method. In the solid-phase method, raw material powders containing metals (for example, metal oxides or metal carbonates) are mixed and heat-treated at a predetermined temperature to cause a reaction. In the liquid-phase method, a solution containing metals is prepared; and a solid phase is obtained by precipitating the solid phase from this solution or by applying the solution onto a substrate and subsequently subjecting the solution to drying and a heat treatment at a predetermined temperature or the like. In the gas-phase method, vapor deposition, sputtering, CVD, or the like is carried out to provide a film-shaped solid phase. Among these methods, the solid-phase method is desirable because it can be carried out at low cost and is suitable as a method of providing a sinter.

The raw materials used in the solid-phase method may be commonly used raw material powders of oxides, carbonates, or the like. In the solid-phase method, such raw material powders are mixed with, for example, a ball mill to prepare a powder mixture; this powder mixture is heat-treated with, for example, a normal electric furnace to thereby provide a phosphor material. The atmosphere during the heat treatment may be an inert gas atmosphere such as $N_2$ gas. Alternatively, the heat treatment may be carried out in the air because $Eu^{3+}$ emits light in a red phosphor material according to this embodiment.

In a case of producing a sinter, a powder mixture of raw materials may be heat-treated to prepare a phosphor powder and this powder may be subsequently sintered. However, use of such a production method usually results in a low degree of sintering and the resultant sinter tends not to have a high density. For this reason, a powder mixture of raw materials is desirably heat-treated to thereby be sintered. In other words, without carrying out a preliminary heat treatment for preparing a phosphor substance, a single heat treatment is desirably carried out to thereby achieve synthesis and sintering of a phosphor substance. A red phosphor material according to this embodiment is desirably obtained by a heat treatment during which synthesis and sintering of the phosphor substance proceed simultaneously. In this case, prior to the heat treatment, the powder mixture of raw materials may be shaped so as to have a predetermined shape. This shaping may be appropriately performed by a sheet forming process or the like. Alternatively, a commonly used molding process may be employed.

In a case of producing a sinter from a powder prepared as a phosphor substance, a powder of raw materials, desirably not containing the excess component (such as $Li_2O$ or $Na_2O$) and/or the addition component (such as $CaCl_2$ or LiF), is heat-treated to prepare a phosphor powder; this phosphor powder is mixed with the excess component and/or the addition component, shaped, and heat-treated to be sintered. In this way, a low sinter density can be avoided.

A red phosphor material according to an embodiment of the present disclosure is an oxide material. Thus, the heat treatment can be carried out in the air and hence the material can be produced easily at low cost.

A red phosphor material according to an embodiment of the present disclosure can be excited with light having a wavelength in the near ultraviolet to blue region, in particular, 405 nm; the phosphor material emits light at about 615 nm, which is highly visible; and the phosphor material has a good temperature characteristic, specifically, a luminance retention ratio. In addition, the luminance tends not to decrease even in a case of using a high-power excitation source such as a laser diode. A phosphor substance having a short afterglow period (1/10 afterglow for about 1 msec) for $Eu^{3+}$ phosphor substances can also be provided.

According to an embodiment of the present disclosure, a red phosphor material with substantially no variation in emission spectrum in response to temperature can also be provided. In this case, the luminance retention ratio and a photon number retention ratio are substantially the same.

A light-emitting device including a red phosphor material according to the present disclosure, normally includes an excitation light source. The red phosphor material partially absorbs excitation light emitted by the excitation light source and emits red light. Examples of the light-emitting device include various light sources employing a light-emitting diode (LED) or a semiconductor laser diode (LD) and a phosphor substance, such as light sources of projectors, light sources of vehicle-mounted head lamps, and light sources of white LED lighting apparatuses.

Such a light-emitting device includes, as an excitation light source, for example, a semiconductor light-emitting element that emits light having a peak wavelength in the wavelength range of 380 to 470 nm. The semiconductor light-emitting element has a light-emitting layer formed of, for example, a gallium nitride compound semiconductor.

A red phosphor material according to an embodiment of the present disclosure has spectrum peaks for excitation at wavelengths of about 385 nm, about 396 nm, about 405 nm, about 420 nm, and about 465 nm. Thus, the excitation light source such as a semiconductor light-emitting element desirably has an emission wavelength that is close to one of these wavelengths.

A light-emitting device according to an embodiment of the present disclosure is a white LED. This white LED is not particularly limited in terms of configuration or production method. For example, the white LED can be produced in the same manner as in existing white LEDs except that existing red phosphor materials are replaced by a red phosphor material according to an embodiment of the present disclosure.

EXAMPLES

Hereinafter, the present disclosure will be described further in detail with reference to Examples and Comparative examples. However, the present disclosure is not limited to the following Examples.

Example 1

The starting materials used were $CaCO_3$, $Li_2CO_3$, $Eu_2O_3$, $Sm_2O_3$, and $WO_3$ powders of the guaranteed reagent grade or higher. The predetermined amounts of these raw materials were weighed and prepared. These raw material powders were wet-blended with pure water as a medium in a ball mill, and dried at 130° C. to provide a powder mixture. Subsequently, this powder mixture was fired at 1100° C. in the air for 2 hours to provide a phosphor powder that was not a sinter.

The above-described raw materials were added such that atomic proportions of Ca, Li, Eu, Sm, and W satisfied values in Table 1. In particular, $Li_2CO_3$ was excessively added: the amount of $Li_2CO_3$ added was converted in terms of oxide into an amount (weight) of $Li_2O$; an excess amount (weight) of $Li_2O$ was determined by subtracting, from this amount, a required amount of $Li_2O$ stoichiometrically determined on the basis of the formula of the essential component; and the ratio of this excess amount to the entirety of the red phosphor material was 0.3%.

Such obtained phosphor powders were measured with a fluorescence spectrometer FP-6500 (light source: xenon lamp) manufactured by JASCO Corporation in terms of emission spectrum in the range of 550 nm to 750 nm with excitation light at a wavelength of 405 nm. In addition, the phosphor powders were measured at an emission wavelength of 615 nm in terms of excitation spectrum in the range of 350 nm to 500 nm.

The No. 2 phosphor powder was also measured in terms of luminance retention ratio in the range of 30° C. to 200° C. with the fluorescence spectrometer with excitation light at a wavelength of 405 nm. The luminance retention ratio was determined in the following manner: at measurement temperatures, the luminance of light emitted by the phosphor powder in the wavelength range of 550 to 750 nm was measured with excitation light at a wavelength of 405 nm; and the ratio of the luminance of emitted light at 200° C. to the luminance of emitted light at 30° C. (the luminance retention ratio in the range of 30° C. to 200° C.) was calculated. In this measurement, the temperature of the atmosphere was sequentially increased to 30° C., 50° C., 150° C., and to 200° C.; and the luminance of emitted light was measured at each of these temperatures.

The results are illustrated in FIGS. 1 to 3.

Referring to FIG. 1, Sample Nos. 1 and 2 excited with light at 405 nm exhibited very similar emission spectra and were found to be red phosphor materials that emit light having a main peak at 615 nm. No. 1 exhibited a much lower emission intensity than No. 2.

Referring to FIG. 2, Sample No. 1, which contained no Sm, had excitation spectrum peaks at about 385 nm, about 396 nm, about 420 nm, and about 465 nm. Sample No. 2 had, in addition to these peaks, another excitation spectrum peak at about 405 nm. Introduction of Sm allows efficient excitation even with readily available LED chips or semiconductor lasers that emit light at 405 nm. In FIG. 1, No. 1 exhibited a small emission peak. This is because excitation was caused with light at 405 nm.

Referring to FIG. 3, the Sample No. 2 phosphor material had good luminance retention ratios relative to the luminance at 30° C.: 95.1% at 150° C., and 90.3% at 200° C.

TABLE 1

| No. | Essential component (atomic proportions) | | | | | Excess component (wt %) | Example/ Comparative example |
|---|---|---|---|---|---|---|---|
| | A | R | Eu | Sm | M | | |
| 1 | Ca = 1.0 | Li = 0.5 | 0.50 | 0 | W = 2.0 | $Li_2O$ = 0.3 | Comparative example |
| 2 | Ca = 1.0 | Li = 0.5 | 0.48 | 0.02 | W = 2.0 | $Li_2O$ = 0.3 | Example |

Example 2

Powder mixtures having composition proportions in Nos. 5 to 49 in Table 2 were prepared as in Example 1 except that raw materials not described in Example 1 were additionally used: oxides, carbonates, and the like of the guaranteed reagent grade or higher ($La_2O_3$, $Gd_2O_3$, $Y_2O_3$, $MoO_3$, $Na_2CO_3$, $K_2CO_3$, $SrCO_3$, $BaCO_3$, $CaCl_2$, $SrCl_2$, $BaCl_2$, LiF, and $ZnF_2$). These powders were compacted with molds having a diameter of 20 mm. The resultant compacts were fired at 800° C. to 1000° C. for 4 hours in the air. Thus, sintered samples having a diameter of about 14 mm and a thickness of about 1 mm were obtained.

These sinters were measured in terms of luminance retention ratio in the range of 30° C. to 200° C. as in Example 1. In addition, an absolute PL quantum yields measurement system Model C9920 manufactured by Hamamatsu Photonics K. K. was used to measure, at an excitation wavelength of 405 nm, internal quantum efficiency (IQE), excitation light absorbance (Abs.), and the product of IQE and Abs., external quantum efficiency (EQE).

In addition, the Sample Nos. 1 and 2 phosphor powders produced in Example 1 were compacted and, without being fired, measured in the same manner as above. These samples were defined as Sample Nos. 1 and 2 in Example 2. In addition, sintered samples having the same compositions as Sample Nos. 1 and 2 in Example 1 were produced in the same manner as above. These samples were defined as Sample Nos. 3 and 4 in Example 2. These samples were also evaluated in the same manner as above. Note that the luminance retention ratio was not measured for samples having an EQE of less than 20%. The results are summarized in Table 2.

TABLE 2

| No | Essential component (atomic proportions) | | | | | | Excess/addition component (wt %) | Light-emitting efficiency (%) | | | Retention ratio (%) | E/C |
|---|---|---|---|---|---|---|---|---|---|---|---|---|
| | A | R | Eu | Sm | Ln | M | | IQE | Abs. | EQE | | |
| 1 | Ca = 1.0 | Li = 0.5 | 0.5 | 0 | — | W = 2.0 | $Li_2O$ = 0.3 | 55.5 | 22.9 | 12.7 | — | C |
| 2 | Ca = 1.0 | Li = 0.5 | 0.48 | 0.02 | — | W = 2.0 | $Li_2O$ = 0.3 | 65.0 | 48.5 | 31.5 | 90.3 | E |
| 3 | Ca = 1.0 | Li = 0.5 | 0.5 | 0 | — | W = 2.0 | $Li_2O$ = 0.3 | 59.7 | 31.3 | 18.7 | — | C |
| 4 | Ca = 1.0 | Li = 0.5 | 0.48 | 0.02 | — | W = 2.0 | $Li_2O$ = 0.3 | 68.9 | 62.8 | 43.3 | 90.6 | E |
| 5 | Ca = 0.4 | Li = 0.8 | 0.78 | 0.02 | — | W = 2.0 | $Li_2O$ = 0.3 | 73.3 | 64.1 | 47.0 | 74.3 | C |
| 6 | Ca = 0.6 | Li = 0.7 | 0.68 | 0.02 | — | W = 2.0 | $Li_2O$ = 0.3 | 71.7 | 66.7 | 47.8 | 86.5 | E |
| 7 | Ca = 0.8 | Li = 0.6 | 0.58 | 0.02 | — | W = 2.0 | $Li_2O$ = 0.3 | 71.3 | 65.1 | 46.4 | 90.3 | E |
| 8 | Ca = 1.2 | Li = 0.4 | 0.38 | 0.02 | — | W = 2.0 | $Li_2O$ = 0.3 | 63.5 | 63.1 | 40.1 | 91.0 | E |
| 9 | Ca = 1.6 | Li = 0.2 | 0.18 | 0.02 | — | W = 2.0 | $Li_2O$ = 0.3 | 52.9 | 58.4 | 30.9 | 91.4 | E |
| 10 | Ca = 1.8 | Li = 0.1 | 0.08 | 0.02 | — | W = 2.0 | $Li_2O$ = 0.3 | 37.8 | 51.0 | 19.3 | — | C |
| 11 | Ca = 1.0 | Li = 0.5 | 0.38 | 0.02 | Gd = 0.1 | W = 2.0 | $Li_2O$ = 0.3 | 71.2 | 64.6 | 46.0 | 91.9 | E |
| 12 | Ca = 0.8 | Li = 0.6 | 0.38 | 0.02 | Gd = 0.2 | W = 2.0 | $Li_2O$ = 0.3 | 76.0 | 65.1 | 49.5 | 92.3 | E |
| 13 | Ca = 0.6 | Li = 0.7 | 0.38 | 0.02 | Gd = 0.3 | W = 2.0 | $Li_2O$ = 0.3 | 76.1 | 64.8 | 49.3 | 91.6 | E |
| 14 | Ca = 0.4 | Li = 0.8 | 0.38 | 0.02 | Gd = 0.4 | W = 2.0 | $Li_2O$ = 0.3 | 75.5 | 64.5 | 48.7 | 88.6 | E |
| 15 | Ca = 0.2 | Li = 0.9 | 0.38 | 0.02 | Gd = 0.5 | W = 2.0 | $Li_2O$ = 0.3 | 73.7 | 64.5 | 47.5 | 87.8 | E |
| 16 | Ca = 1.2 | Li = 0.4 | 0.28 | 0.02 | Gd = 0.1 | W = 2.0 | $Li_2O$ = 0.3 | 70.1 | 62.2 | 43.6 | 91.6 | E |
| 17 | Ca = 1.2 | Li = 0.4 | 0.18 | 0.02 | Gd = 0.2 | W = 2.0 | $Li_2O$ = 0.3 | 64.5 | 58.8 | 37.9 | 92.5 | E |
| 18 | Ca = 1.2 | Li = 0.4 | 0.08 | 0.02 | Gd = 0.3 | W = 2.0 | $Li_2O$ = 0.3 | 40.0 | 53.0 | 21.2 | — | C |
| 19 | Ca = 0.6 | Li = 0.7 | 0.58 | 0.02 | Gd = 0.1 | W = 2.0 | $Li_2O$ = 0.3 | 74.7 | 65.3 | 48.8 | 90.9 | E |

TABLE 2-continued

| No | Essential component (atomic proportions) | | | | | | Excess/addition component (wt %) | Light-emitting efficiency (%) | | | Retention ratio (%) | E/C |
|---|---|---|---|---|---|---|---|---|---|---|---|---|
| | A | R | Eu | Sm | Ln | M | | IQE | Abs. | EQE | | |
| 20 | Ca = 0.6 | Li = 0.7 | 0.18 | 0.02 | Gd = 0.5 | W = 2.0 | Li$_2$O = 0.3 | 58.3 | 62.4 | 36.4 | 92.0 | E |
| 21 | Ca = 0.6 | Li = 0.7 | 0.08 | 0.02 | Gd = 0.6 | W = 2.0 | Li$_2$O = 0.3 | 40.7 | 55.5 | 22.6 | — | C |
| 22 | Ca = 0.4 | Li = 0.8 | 0.58 | 0.02 | Gd = 0.2 | W = 2.0 | Li$_2$O = 0.3 | 74.7 | 64.4 | 48.1 | 86.2 | E |
| 23 | Ca = 0.4 | Li = 0.8 | 0.18 | 0.02 | Gd = 0.6 | W = 2.0 | Li$_2$O = 0.3 | 54.3 | 63.0 | 34.2 | 89.3 | E |
| 24 | Ca = 0.8 | Li = 0.6 | 0.397 | 0.003 | Gd = 0.2 | W = 2.0 | Li$_2$O = 0.3 | 68.6 | 42.4 | 29.1 | 96.8 | C |
| 25 | Ca = 0.8 | Li = 0.6 | 0.395 | 0.005 | Gd = 0.2 | W = 2.0 | Li$_2$O = 0.3 | 72.2 | 50.3 | 36.3 | 95.6 | E |
| 26 | Ca = 0.8 | Li = 0.6 | 0.39 | 0.01 | Gd = 0.2 | W = 2.0 | Li$_2$O = 0.3 | 75.7 | 58.4 | 44.2 | 94.1 | E |
| 27 | Ca = 0.8 | Li = 0.6 | 0.36 | 0.04 | Gd = 0.2 | W = 2.0 | Li$_2$O = 0.3 | 69.0 | 70.8 | 48.9 | 91.5 | E |
| 28 | Ca = 0.8 | Li = 0.6 | 0.32 | 0.08 | Gd = 0.2 | W = 2.0 | Li$_2$O = 0.3 | 65.3 | 72.9 | 47.6 | 85.6 | E |
| 29 | Ca = 0.8 | Li = 0.6 | 0.30 | 0.10 | Gd = 0.2 | W = 2.0 | Li$_2$O = 0.3 | 60.5 | 73.2 | 46.7 | 82.9 | C |
| 30 | Ca = 0.8 | Li = 0.6 | 0.38 | 0.02 | La = 0.2 | W = 2.0 | Li$_2$O = 0.3 | 71.5 | 64.9 | 46.4 | 89.2 | E |
| 31 | Ca = 0.8 | Li = 0.6 | 0.38 | 0.02 | Y = 0.2 | W = 2.0 | Li$_2$O = 0.3 | 68.3 | 66.2 | 45.2 | 86.4 | E |
| 32 | Sr = 0.8 | Li = 0.6 | 0.38 | 0.02 | Gd = 0.2 | W = 2.0 | Li$_2$O = 0.3 | 53.5 | 61.8 | 33.1 | 85.5 | E |
| 33 | Ba = 0.8 | Li = 0.6 | 0.38 | 0.02 | Gd = 0.2 | W = 2.0 | Li$_2$O = 0.3 | 46.9 | 59.8 | 28.0 | 83.0 | C |
| 34 | Ca = 0.8 | Na = 0.6 | 0.38 | 0.02 | Gd = 0.2 | W = 2.0 | Na$_2$O = 0.3 | 73.7 | 60.4 | 44.5 | 91.9 | E |
| 35 | Ca = 0.8 | K = 0.6 | 0.38 | 0.02 | Gd = 0.2 | W = 2.0 | K$_2$O = 0.3 | 45.4 | 67.3 | 30.6 | 90.6 | E |
| 36 | Ca = 0.8 | Li = 0.6 | 0.38 | 0.02 | Gd = 0.2 | Mo = 2.0 | Li$_2$O = 0.3 | 75.8 | 63.6 | 48.2 | 87.1 | E |
| 37 | Ca = 0.8 | Li = 0.6 | 0.38 | 0.02 | Gd = 0.2 | W = 2.0 | — | 55.5 | 59.3 | 32.9 | 90.6 | E |
| 38 | Ca = 0.8 | Li = 0.6 | 0.38 | 0.02 | Gd = 0.2 | W = 2.0 | Li$_2$O = 0.3 | 59.0 | 62.6 | 36.9 | 90.8 | E |
| 39 | Ca = 0.8 | Li = 0.6 | 0.38 | 0.02 | Gd = 0.2 | W = 2.0 | Li$_2$O = 0.3 | 67.3 | 64.0 | 43.1 | 91.2 | E |
| 40 | Ca = 0.8 | Li = 0.6 | 0.38 | 0.02 | Gd = 0.2 | W = 2.0 | Li$_2$O = 0.3 | 70.1 | 64.7 | 45.4 | 92.4 | E |
| 41 | Ca = 0.8 | Li = 0.6 | 0.38 | 0.02 | Gd = 0.2 | W = 2.0 | Li$_2$O = 0.3 | 54.7 | 65.0 | 35.6 | 91.8 | E |
| 42 | Ca = 0.8 | Li = 0.6 | 0.38 | 0.02 | Gd = 0.2 | W = 2.0 | Li$_2$O = 0.3 | 49.6 | 61.9 | 30.7 | 90.2 | E |
| 43 | Ca = 0.8 | Li = 0.6 | 0.38 | 0.02 | Gd = 0.2 | W = 2.0 | Na$_2$O = 0.3 | 73.8 | 63.4 | 46.8 | 91.0 | E |
| 44 | Ca = 0.8 | Li = 0.6 | 0.38 | 0.02 | Gd = 0.2 | W = 2.0 | K$_2$O = 0.3 | 65.9 | 62.7 | 41.3 | 90.7 | E |
| 45 | Ca = 0.8 | Li = 0.6 | 0.38 | 0.02 | Gd = 0.2 | W = 2.0 | CaCl$_2$ = 0.3 | 73.4 | 62.8 | 46.1 | 91.3 | E |
| 46 | Ca = 0.8 | Li = 0.6 | 0.38 | 0.02 | Gd = 0.2 | W = 2.0 | SrCl$_2$ = 0.3 | 71.0 | 61.4 | 43.6 | 91.1 | E |
| 47 | Ca = 0.8 | Li = 0.6 | 0.38 | 0.02 | Gd = 0.2 | W = 2.0 | BaCl$_2$ = 0.3 | 66.4 | 61.0 | 40.5 | 90.9 | E |
| 48 | Ca = 0.8 | Li = 0.6 | 0.38 | 0.02 | Gd = 0.2 | W = 2.0 | LiF = 0.3 | 76.7 | 64.3 | 47.3 | 91.8 | E |
| 49 | Ca = 0.8 | Li = 0.6 | 0.38 | 0.02 | Gd = 0.2 | W = 2.0 | ZnF$_2$ = 0.3 | 66.6 | 60.5 | 40.3 | 90.8 | E |

E: Example, C: Comparative example, Retention ratio: luminance retention ratio in the range of 30° C. to 200° C., Content of excess component: ratio of excess component to the entirety of the phosphor material The measurements were carried out with excitation light at 405 nm. Accordingly, Nos. 1 and 3 not containing Sm have a low Abs., which results in a low EQE. In contrast, Nos. 2 and 4 containing Sm have a high Abs. and a high EQE. Comparison between Nos. 2 and 4 indicates that formation as a sinter results in an increase in Abs. and an increase in EQE.

In Nos. 4 to 29, the conditions of the excess component were fixed and proportions in the essential component serving as the main component were varied. In Nos. 4 to 10, the Sm proportion (z) was fixed and the total proportion of "Eu+Sm" (y+z) was varied. As a result, No. 5 having "y+z" of more than 0.7 had a low luminance retention ratio of less than 85%; and No. 10 having "y+z" of less than 0.2 had a very low EQE.

In No. 8 and Nos. 11 to 15, the Eu proportion (y) and the Sm proportion (z) were fixed and the Li proportion (x) was varied to increase to thereby increase the Gd proportion (x−y−z). This resulted in an increase in EQE and an increase in the luminance retention ratio. However, when the Li proportion (x) became excessively high and the Ca proportion (2−2x) became low, EQE and the luminance retention ratio decreased.

In No. 12 and Nos. 24 to 29, the "Eu+Sm" proportion (y+z) was fixed and the Sm proportion (z) was varied. As with No. 3 not containing Sm, No. 24 in which z was less than 0.005 did not considerably absorb excitation light at 405 nm and had a low EQE. No. 29 in which z was more than 0.08 had a luminance retention ratio of less than 85%.

In summary, the following have been demonstrated. A red phosphor material that satisfies 0.2≤x<1.0, 0.2≤y+z≤0.7, and 0.005≤z≤0.08 can be excited at a wavelength of 405 nm and has a luminance retention ratio of 85% or more. In particular, a red phosphor material that satisfies 0.2≤x≤0.7, 0.2≤y+z≤0.6, and 0.005≤z≤0.04 has a luminance retention ratio of 90% or more. A red phosphor material that satisfies these ranges and contains, as Ln, Gd with a Gd proportion (x−y−z) of 0.1 or more has a high EQE and a high retention ratio.

In Nos. 30 to 36, Ln was Gd, La, or Y; A was Ca, Sr, or Ba; R was Li, Na, or K; and M was W or Mo.

Comparison between Nos. 30 to 36 and No. 12 indicates the following. Regarding Ln, in the case of using Gd, EQE and the luminance retention ratio were the highest. Regarding A, in the cases of using Sr or Ba, properties were considerably degraded. In particular, in the case of using Ba, EQE was less than 30% and the luminance retention ratio was less than 85%. Most desirably A represents Ca. Regarding R, there were no big differences between the cases of using Li or Na. However, in the case of using K as R, properties were considerably degraded. Most desirably R represents Li and secondarily Na. Regarding M, in the case of using Mo, the luminance retention ratio was decreased. Accordingly, M desirably represents W.

In Nos. 37 to 44, the amount and type of alkali metal oxide serving as an additive were varied. No. 12 and Nos. 37 to 44 indicate that use of Li$_2$O, Na$_2$O, or K$_2$O as an additive results in an increase in IQE and an increase in Abs. As a result, EQE was also increased and the luminance retention ratio was also increased. In the cases of adding an excess component in the range of 0.1% to 1.0% by weight, good results were obtained. An improvement in Abs. due to this addition was markedly achieved for phosphor materials that were sinters. This is probably because addition of the excess component resulted in an increase in the density of the sinters. In Nos. 45 to 49, $CaCl_2$, $SrCl_2$, $BaCl_2$, LiF, or $ZnF_2$ was added as an addition component. In these cases, the effects provided as in the addition of alkali metal oxide were observed.

Similarly, the inventors of the present disclosure carried out experiments in terms of other various compositions. As a result, the inventors have confirmed that red phosphor materials within the scope of the present disclosure have excellent properties as in the above-described Examples.

Example 3

The No. 2 powder in Example 1 was prepared and added in a ratio of 10% by weight to a dimethyl silicone resin. The resultant mixture was kneaded with a three-roll kneader to provide an uncured phosphor resin mixture.

Subsequently, an LED chip that emitted light having a central wavelength of 405 nm was prepared. This LED chip was covered with the phosphor resin mixture and heated to cure the resin. Thus, an LED device was produced. Current was passed through the LED chip to cause light emission. It was confirmed that red light was observed.

A red phosphor material according to the present disclosure is useful for various applications. Specifically, for example, the red phosphor material can be used for a light-emitting diode (LED). The red phosphor material can also be used for various light sources such as light sources of vehicle-mounted head lamps, light sources of white LED lighting apparatuses, and light sources of projectors employing a semiconductor laser diode (LD) and a phosphor substance.

What is claimed is:

1. A red phosphor material comprising:
   an essential component represented by a formula of $A_{2-2x}R_xEu_ySm_zLn_{x-y-z}M_2O_8$ as a main component; and
   an excess component that is at least one selected from $Li_2O$, $Na_2O$, and $K_2O$,
   where A represents at least one selected from Ca and Sr;
   R represents at least one selected from Li, Na, and K;
   Ln represents at least one selected from La, Gd, and Y;
   M represents at least one selected from W and Mo; and
   x, y, and z are numerical values that satisfy $0.2 \leq x \leq 0.7$, $0.2 \leq y+z \leq 0.6$, $0.005 \leq z \leq 0.04$, and $x-y-z \geq 0$,
   wherein a content of the excess component relative to an entirety of the red phosphor material is 0.05% to 2.0% by weight.

2. The red phosphor material according to claim 1, further comprising an addition component that is at least one selected from $CaCl_2$, $SrCl_2$, $BaCl_2$, LiF, and $ZnF_2$, wherein a content of the excess component and the addition component relative to an entirety of the red phosphor material is 0.05% to 2.0% by weight.

3. The red phosphor material according to claim 2, consisting essentially of the essential component, the excess component and the addition component.

4. The red phosphor material according to claim 1, consisting essentially of the essential component and the excess component.

5. The red phosphor material according to claim 1, being a sinter.

6. The red phosphor material according to claim 1, wherein Ln represents Gd.

7. The red phosphor material according to claim 1, wherein M represents W.

8. The red phosphor material according to claim 1, wherein R represents at least one selected from Li and Na.

9. The red phosphor material according to claim 1, wherein a ratio of a luminance of emitted light at a wavelength of 615 nm as a result of excitation with light having a wavelength of 405 nm at 200° C. to a luminance of emitted light at a wavelength of 615 nm as a result of excitation with light having a wavelength of 405 nm at 30° C. is 85% or more.

10. A red phosphor material comprising:
    an essential component represented by a formula of $A_{2-2x}R_xEu_ySm_zLn_{x-y-z}M_2O_8$ as a main component; and
    an addition component that is at least one selected from $CaCl_2$, $SrCl_2$, $BaCl_2$, LiF, and $ZnF_2$, wherein a content of the addition component relative to an entirety of the red phosphor material is 0.05% to 2.0% by weight,
    where A represents at least one selected from Ca and Sr;
    R represents at least one selected from Li, Na, and K;
    Ln represents at least one selected from La, Gd, and Y;
    M represents at least one selected from W and Mo; and
    x, y, and z are numerical values that satisfy $0.2 \leq x \leq 0.7$, $0.2 \leq y+z \leq 0.6$, $0.005 \leq z \leq 0.04$, and $x-y-z \geq 0$.

11. The red phosphor material according to claim 10, consisting essentially of the essential component and the addition component.

12. The red phosphor material according to claim 10, wherein Ln represents Gd.

13. The red phosphor material according to claim 10, wherein M represents W.

14. The red phosphor material according to claim 10, wherein R represents at least one selected from Li and Na.

15. The red phosphor material according to claim 10, wherein a ratio of a luminance of emitted light at a wavelength of 615 nm as a result of excitation with light having a wavelength of 405 nm at 200° C. to a luminance of emitted light at a wavelength of 615 nm as a result of excitation with light having a wavelength of 405 nm at 30° C. is 85% or more.

16. A red phosphor material comprising:
    an essential component represented by a formula of $A_{2-2x}R_xEu_ySm_zLn_{x-y-z}M_2O_8$ as a main component,
    where A represents at least one selected from Ca and Sr;
    R represents at least one selected from Li, Na, and K;
    Ln represents at least one selected from La, Gd, and Y;
    M represents at least one selected from W and Mo; and
    x, y, and z are numerical values that satisfy $0.2 \leq x \leq 0.7$, $0.2 \leq y+z \leq 0.6$, $0.005 \leq z \leq 0.04$, and $x-y-z \geq 0$,
    wherein $x-y-z \geq 0.1$.

17. The red phosphor material according to claim 16, consisting essentially of the essential component.

18. The red phosphor material according to claim 16, wherein Ln represents Gd.

19. The red phosphor material according to claim 16, wherein M represents W.

20. The red phosphor material according to claim 16, wherein R represents at least one selected from Li and Na.

21. The red phosphor material according to claim 16, wherein a ratio of a luminance of emitted light at a wavelength of 615 nm as a result of excitation with light having a wavelength of 405 nm at 200° C. to a luminance of emitted light at a wavelength of 615 nm as a result of excitation with light having a wavelength of 405 nm at 30° C. is 85% or more.

* * * * *